(12) United States Patent
Williamson, Jr. et al.

(10) Patent No.: US 6,826,721 B2
(45) Date of Patent: Nov. 30, 2004

(54) DATA ACCELERATOR AND METHODS FOR INCREASING DATA THROUGHPUT

(75) Inventors: Eddie L. Williamson, Jr., Ft. Collins, CO (US); Kevin Lee Wible, Loveland, CO (US); Stephen P. Rozum, Loveland, CO (US)

(73) Assignee: Agilent Technoloiges, Inc., Palo Alto, CA (US)

( * ) Notice: Subject to any disclaimer, the term of this patent is extended or adjusted under 35 U.S.C. 154(b) by 450 days.

(21) Appl. No.: 10/002,017

(22) Filed: Nov. 1, 2001

(65) Prior Publication Data

US 2003/0084388 A1 May 1, 2003

(51) Int. Cl.[7] .............................................. G01R 31/28
(52) U.S. Cl. ..................................... 714/725; 714/718
(58) Field of Search ........................ 702/118; 712/245; 714/738, 736, 725, 718

(56) References Cited

U.S. PATENT DOCUMENTS

| | | |
|---|---|---|
| 4,216,533 A | 8/1980 | Ichimiya et al. |
| 4,598,245 A | 7/1986 | Groves et al. ................. 324/73 |
| 4,642,561 A | 2/1987 | Groves et al. ................. 324/73 |
| 4,652,814 A | 3/1987 | Groves et al. ................. 324/73 |
| 5,402,427 A | 3/1995 | Parker ........................... 371/27 |
| 5,581,491 A * | 12/1996 | Biwer et al. .................. 702/118 |
| 5,654,971 A | 8/1997 | Heitele et al. ................. 371/24 |
| 5,657,486 A * | 8/1997 | Czamara et al. ............. 712/245 |
| 5,825,787 A * | 10/1998 | Statovici ....................... 714/738 |
| 5,951,705 A * | 9/1999 | Arkin et al. .................. 714/738 |
| 6,065,144 A | 5/2000 | Knoch .......................... 714/724 |
| 6,671,844 B1 * | 12/2003 | Krech et al. .................. 714/736 |

FOREIGN PATENT DOCUMENTS

| | | |
|---|---|---|
| GB | 2108278 A | 10/1992 |
| JP | 570131076 | 8/1982 |

* cited by examiner

*Primary Examiner*—David Ton

(57) ABSTRACT

A data accelerator for use in a test vector sequencer includes a data translator, a plurality of sequence memory devices, and a switch. The data translator and the switch are configured via a control signal responsive to an indication that a first sequence memory device is prepared to receive a data segment and that a second sequence memory device is prepared to transfer a previously stored data segment. The test sequencer forwards a first application segment to a first memory device and acquires a subsequent application with a second memory device, detects a condition responsive to the completion of the segment acquisition and forwarding tasks, switches the roles of the first and second memory devices, and repeatedly switches and detects until all application segments have been processed.

32 Claims, 5 Drawing Sheets

DATA ACCELERATOR AND METHODS FOR INCREASING DATA THROUGHPUT

TECHNICAL FIELD

The present disclosure generally relates to systems and methods for circuit testing and more particularly to in-circuit testing and modification of programmable integrated circuit devices.

BACKGROUND OF THE INVENTION

Early generations of circuit testers used a functional testing methodology wherein test signals were applied at various circuit inputs and output signals were monitored at circuit outputs. Such functional testing suffers from at least two limitations. First, it is difficult to formulate thorough and effective test programs suitable for gathering information concerning a variety of circuits designated for test because of the unique nature of individual circuits. Second, fault isolation to a particular element on a printed circuit board or other circuit assembly having many circuit elements requires an accurate operational understanding of the assembled circuit.

These limitations are particularly severe in circuit assemblies that contain sequential data processing circuits (e.g., flip-flops, data buffers, random access memory (RAM), registers, latches, etc.) because the output of the circuit assembly is a function of the state of the circuit, as well as of the applied test (i.e., data) signals. In order to know the state of a circuit with sequential elements, it is generally necessary to apply a set of signals to the inputs of the circuit's sequential elements, which alter each individual element's state until it enters a desired state known as its "home" state. The application of the required signals that result in a particular sequential circuit element reaching its "home" state is known as "homing."

The complicated nature of the relationships between test signals applied at circuit inputs and the resulting signals at the inputs of the individual sequential circuit components, makes it extremely difficult to determine the signals that must be applied at the circuit assembly inputs to "home" each sequential circuit element in the circuit assembly. As a result of the limitations of functional testing, many circuit assembly testers utilize a technique known as in-circuit testing in which individual circuit components (both sequential and non-sequential) are tested via in-circuit application of test signals at the inputs of each component and concurrent observation of resulting output signals at the various outputs of each component. A description of a typical test program and test equipment that may run the test program is provided below.

For simple circuits, testing is often accomplished by applying appropriate voltages to circuit nodes to test for short or open circuits. Circuit nodes are any equipotential circuit element, such as, but not limited to, connecting wires, edge connectors, and connector pins. Functional testing methods as described above may also be performed where the tester and/or test equipment has sufficient knowledge of circuit operation.

As circuit assemblies become more complex, circuit testers have had to adapt in order to accurately and thoroughly test these complex assemblies. With the added complexity and density due to miniaturization, it has become more important, and more difficult, to thoroughly test circuit assemblies.

Many of today's circuit assembly manufacturers develop circuit assembly test methods concurrently with the development of the circuit assemblies that they are to test. Often, printed circuit cards and individual integrated circuits have one or more test ports integrated with the card or the circuit itself to enable testing of the respective device.

Generally, today's automated circuit assembly tests include a test program (i.e., a software application) that operates a test interface that communicates various steady-state voltages and test signals between test equipment and the device under test (DUT). The test interfaces may access the various test ports as well as other circuit nodes on the DUT. The test equipment may include numerous resources, such as voltage drivers, receivers, relays, and test pins arranged to engage appropriate locations of the DUT. The drivers and receivers are alternately connected and may be jointly connected in some embodiments (as for bidirectional data busses) in a systematic and clocked sequence to various nodes of the DUT. The drivers and receivers may be connected via relays and test pins that contact various circuit assembly nodes.

In a typical clock period of the test program, drivers will force a first plurality of test pins in contact with DUT nodes to prescribed voltages and check that receivers connected to a second plurality of test pins in contact with other DUT nodes receive anticipated output signals. If, at any clock cycle in the sequence, the anticipated output signals are not observed, the DUT may be deemed defective. Test abnormalities may be recorded or otherwise indicated by the test equipment. Upon encountering an abnormal result the test may be terminated or the test program may execute steps in an effort to isolate and identify the cause of the abnormal result.

The signals transmitted and received during a test can be viewed as a large matrix of data: the columns of the matrix being associated with a test pin, and the rows of the matrix corresponding to a test vector at a given clock cycle. The matrix is stored and communicated to the test equipment during the test. Generally, the matrix is stored on a non-volatile storage element such as, but not limited to, a magnetic disk or tape. The matrix may then be loaded into a random access memory element as needed to perform the test. The "flattened" or "unrolled" form of the matrix includes test vectors for each clock cycle of the test program. A test vector is the set of signals transmitted to and/or received from the test pins on a given clock cycle.

Storing and using this flattened or unrolled form of the matrix is memory intensive and expensive. Consequently, some systems store the matrix of test vectors in a compressed form. For example, U.S. Pat. No. 4,652,814 describes a system that stores unique test vectors in test equipment memory elements. The system associates a local test data RAM, which contains both stimulus and response data for use at an associated test pin. The stimulus and response data is compressed to reduce the amount of data that is downloaded to perform a particular test. The system apparently described in the '814 patent uses a sequencer that applies the unique test vectors in an order defined by various subroutines, loops, etc. in the test program. During a test, the sequencer forwards the test vectors in the appropriate order to the appropriate pin locations, thus constructing the flattened form of the test from the compressed data.

As electronic devices have become more and more complex, the number of input and output pins associated with individual integrated circuits used in the devices has increased. Consequently, the number of test pins required to test individual on-board integrated circuits and the associated host circuit assemblies has grown commensurately. As the number of test pins, and thus the size of the test vector, becomes large, not only does the test matrix grow the test matrix becomes increasingly difficult to compress.

The compression becomes more difficult because the compression methods attempt to identify sections of a test that are repeated and thus reusable. For example, a sequence of test vectors A-B-C may recur often in a test, and compression methodologies can take advantage of the repetition by storing A-B-C once, and reusing the sequence during the test. However, as test vectors become larger, the chance that a particular sequence of test vectors recurs decreases.

As a result, ever increasing amounts of data must be communicated to the pin electronics (i.e., the various drivers and receivers associated with each of a plurality of test pins that form the physical interface between an in-circuit tester and a DUT) in a testing device in order to thoroughly test both the integrated circuit assemblies and the individual components mounted on the assembly. In addition, manufacturers of devices that use integrated circuit assemblies with programmable integrated circuits have found it desirable from manufacturing and handling perspectives to create application programs that combine the data necessary to program on-board integrated circuits with a test program. The composite application programs can then be used to program and/or otherwise configure the individual programmable devices prior to testing the individual integrated circuit and/or the host circuit assembly.

The combination of the on-board programming information with the test data further increases the data storage capacity required to test today's complex circuit assemblies. Consequently, it is often the case that the amount of data that must be transferred to the test equipment in order to both program the various programmable devices and to thoroughly test the circuit assembly exceeds the storage capacity of the test equipment.

One known method of addressing the problem of insufficient storage space in the test equipment is to divide the application program into a plurality of test and/or program segments. As long as the resulting segments do not separately exceed the storage capacity of the test equipment, the segments can be run separately. However, between each segment, the test sequencer must be paused and the test memory element must be reloaded with the new data. The application program can then be restarted after the next segment has been successfully loaded in the test memory element. While this segmenting approach is functional, its use results in undesirable complexity in developing the segmented tests and delays in the serial programming and testing of mass-produced circuit assemblies due to the need to pause the circuit tester to reload memory elements.

Another known method of addressing the problem of insufficient storage space in the test equipment is to increase the storage capacity of the test memory device. While commercially available RAM devices may provide increased storage capacity over time, each generation is often accompanied by a change in the number of pins and/or interfaces to the device. Furthermore, integrated circuit RAM devices with the storage capacities required to store both the test program and data required to program on-board programmable devices are more expensive than smaller capacity RAM devices. Because test and programming data requirements are expected to grow at a rapid rate, alternative systems and methods are desired to address the insufficient storage capacity and inherently poor data throughput in circuit assembly test and programming devices.

SUMMARY OF THE INVENTION

In response to these and other shortcomings of the prior art, systems and methods for increasing the data throughput and data capacity of digital circuit testers are disclosed. Briefly described, in architecture, an improved circuit tester can be realized with a data accelerator for use in a test vector sequencer. The data accelerator may comprise a data translator, a plurality of sequence memory devices, and a switch. In preferred embodiments, the data translator and the switch are configured via a single control signal responsive to an indication that a first sequence memory device is prepared to receive a data segment and that a second sequence memory device is prepared to simultaneously transfer a previously stored data segment.

Some embodiments of the improved circuit tester can be viewed as providing methods for increasing data throughput. In this regard, a method for increasing data throughput can be summarized by the following steps: a) segmenting a test application into a plurality of application segments; b) acquiring a first application segment in a first test sequencer storage device; c) configuring the test sequencer to forward the first application segment to program or test a circuit and to simultaneously acquire a subsequent application segment in a second test sequencer storage device; d) detecting a condition responsive to the completion of an application segment transfer associated with both the first and second test sequencer storage devices; e) reconfiguring the test sequencer to forward the subsequent application segment and to simultaneously acquire a further subsequent application segment in the first test sequencer storage device; and f) repeating the configuring, forwarding, and detecting steps until the last of the plurality of application segments have been forwarded.

Other systems, methods, and features associated with the improved circuit tester will become apparent to one with skill in the art upon examination of the following drawings and detailed description. It is intended that all such additional systems, methods, and features included within this description, be within the scope of the system and method for increased data throughput and data capacity as protected by the accompanying claims.

BRIEF DESCRIPTION OF THE DRAWINGS

The system and method for increased data throughput can be better understood with reference to the following drawings. The components in the drawings are not necessarily to scale, emphasis instead is placed upon clearly illustrating the principles of improved circuit tester. Moreover, in the drawings, like reference numerals designate corresponding parts throughout the several views.

DETAILED DESCRIPTION

Figure 1:
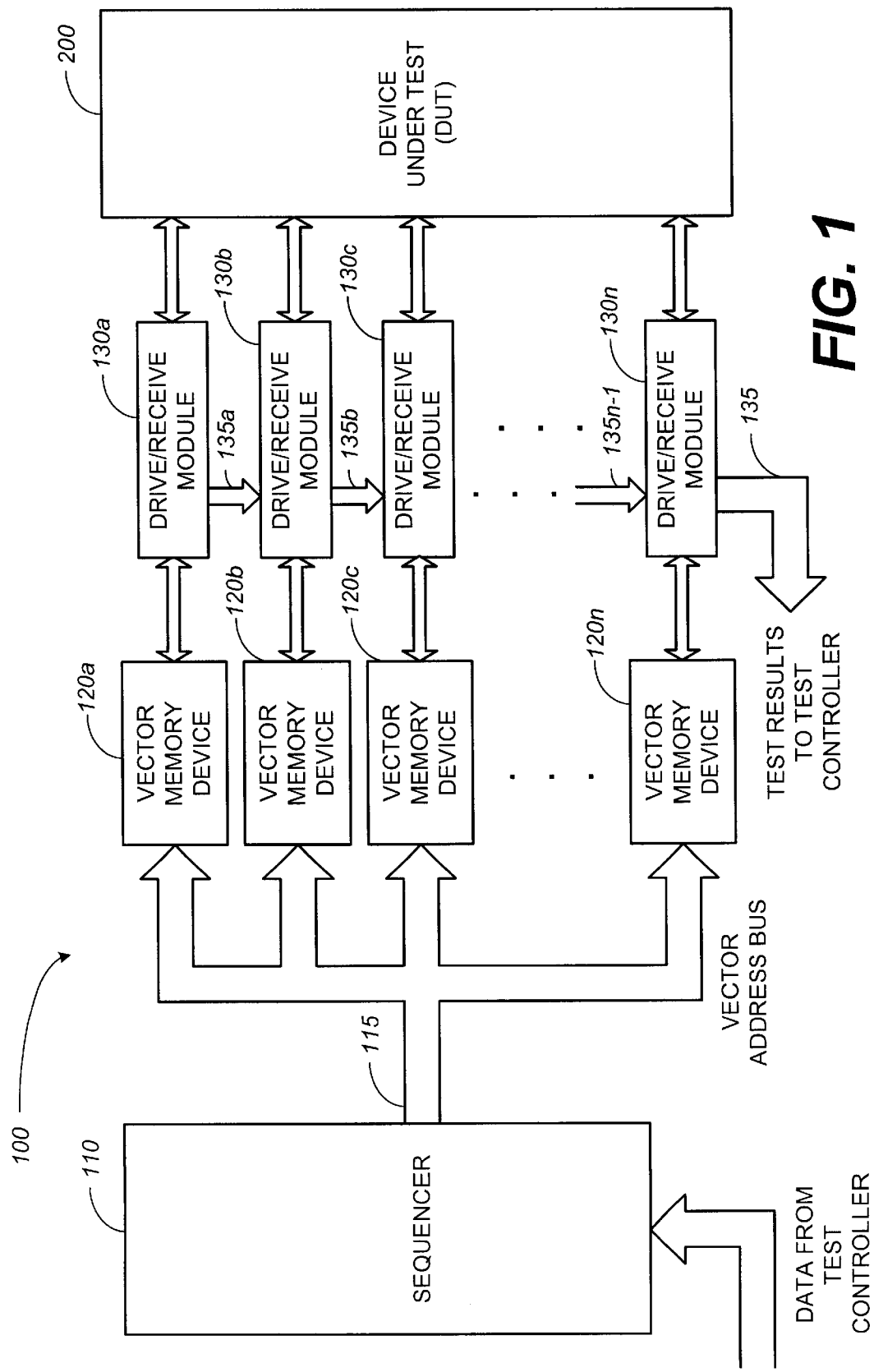
FIG. 1 is a functional block diagram illustrating data flow in an exemplar test and in-circuit programming system.

Various aspects of the system and method for increased data throughput and data capacity, having been summarized above, reference will now be made in detail to the description of the exemplar systems and methods as illustrated in the drawings. While the systems and methods for increased data throughput will be described in connection with these drawings, there is no intent to limit it to the embodiment or embodiments disclosed therein. On the contrary, the intent is to cover all alternatives, modifications, and equivalents included within the spirit and scope of the systems and methods for increased data throughput as defined by the appended claims.

Generally, an improved circuit tester may be applied in the test system illustrated in FIG. 1 in order to a transfer test application and programmable device data when desired to a DUT (e.g., a printed circuit card assembly). As illustrated in the functional block diagram of FIG. 1, a circuit tester 100 may comprise a sequencer 110, a vector address bus 115, a plurality of vector memory devices 120 each associated with its respective drive/receive module 130. Each of the drive/receive module 130a, 130b, 130c, . . . , 130n interface with the DUT 200 via a plurality of pins associated with each of the various drive/receive module 130. Similarly, the drive/receive module 130a, 130b, 130c, . . . , 130n interface with the DUT 200 to capture and forward test results back to the sequencer 110.

As illustrated in FIG. 1, the sequencer 110 is configured to receive data from a test controller. The sequencer 110 may include a directory memory device and a sequence memory device (not shown in FIG. 1). The sequencer 110 may also receive a system clock signal as well as other control signals from the test controller. The directory memory device may be pre-loaded with a program that generates a sequence of addresses that is forwarded to the sequence memory device. The output of the sequence memory device is the vector address that is forwarded along the vector address bus 115 to the plurality of vector memory devices 120a, 120b, 120c, . . . , 120n. The output from the vector memory devices 120a, 120b, 120c, . . . , 120n in turn is forwarded to the respective drive/receive electronics modules 130a, 130b, 130c, . . . , 130n which in turn deliver and receive signals from the DUT 200.

Each of the respective drive/receive module 130 contains a set of bi-directional test pins—i.e., test pins which can each be individually used to supply test signals to the DUT 200 or to monitor output data from the DUT 200. Each of the respective vector memory devices 120 associated with the individual drive/receive module 130 contains stimulus and expected response data for use at a particular test pin. The stimulus and expected response data stored in each vector memory device 120 may be compressed to reduce the amount of data that must be downloaded to perform a given test.

The test signals produced at each pin may also be varied in multiple modes. In a raw data mode the stimulus and expected response data indicates whether the signal on the pin is to be driven to logic high or logic low. In a derivative mode, the stimulus and expected response data indicates whether the signal on the pin is to be kept in its present state or toggled to its complementary state. Those skilled in the art will appreciate that these "keep" and "toggle" modes can dramatically compress the amount of unique vectors, which can be encoded in the vector memory devices 120.

The individual pin driver circuits within each of the drive/receive module 130 may be configured to also monitor the signal on the pin and compare it on-the-fly (i.e., as each data item is monitored) with the signal expected on each particular pin. A pin pass/fail determination can be generated in response to this comparison and this pin pass/fail signal can be enabled or disabled depending on whether the test procedure is designed to test that information. As illustrated in the schematic of FIG. 1, the drive/receive module 130a, 130b, 130c, . . . , 130n may each be configured with a corresponding test results port 135 for forwarding test results to the test controller.

Each vector memory device 120 contains the stimulus and expected response data for its associated pin driver circuit in the associated drive/receive module 130. Each of the vector memory devices 120 has the same range of addresses. The set of bits in the plurality of vector memory devices 120 forms a "data vector." The vector memory devices 120 are all accessed concurrently by a single data vector address and the drive/receive module 130 are responsive to the data vector resulting from such an access to produce on the pins a pattern of signals called a "vector."

The vector memory devices 120 contain only the unique data vectors utilized during a given circuit test—i.e., these vector memory devices 120 contain only a single copy of each data vector utilized during a test. The elimination of redundant data vectors compresses the amount of data stored, thereby reducing the amount of downloaded data required to implement a given test. Because only the unique data vectors are stored in these devices, the sequencing of this data is controlled by a sequencer 110, which provides each of the vector memory devices 120 with the address of the data vector to be utilized at any given time.

The sequencing information can be stored in the sequencer 110 by storing data vector addresses in the sequencer 110 in the order in which the data vectors at those addresses are to be accessed from the vector memory devices 120. However, the sequencer 110 may also contain logic that enables the sequencer data to be compressed. The sequencer 110 contains the capability of implementing nested loops, subroutines utilizing vector parameters, and other programming techniques that enable the sequence information to be stored as a program instead of just an ordered list of data vector addresses. The sequencer 110 may also contain a set of counter/registers and associated logic that enable the counters to be utilized in keeping track of program loops and subroutines. In addition, these counters may be connected to a priority encoder which is used to produce a sequence of addresses which are supplied in derivative mode to the vector memory devices 120 to produce test signals equivalent to those which would result if the counters were directly connected to the test pins.

As described above, it is often the case that a complex DUT 200 will require a test application program that exceeds the storage capacity of the sequence memory device in the sequencer 110. This is also often the case when a circuit tester, such as the circuit tester 100 illustrated in FIG. 1, is used to program in-circuit programmable devices, which can require very long sequences of vectors to program the devices. Stated another way, the amount of data required to program the various drive/receive module 130 and/or to store a program into one or more programmable devices is more than will fit in the sequence memory at once. The limited storage capacity of the sequencer 110 requires the segmentation of the test application program and/or the programmable device data into a plurality of segments. In an improved circuit tester, constructed using principles of the present invention, the sequencer 110 no longer needs to be stopped and the sequence memory reloaded between each of the plurality of test application segments and/or between programmable data segments.

Figure 2:
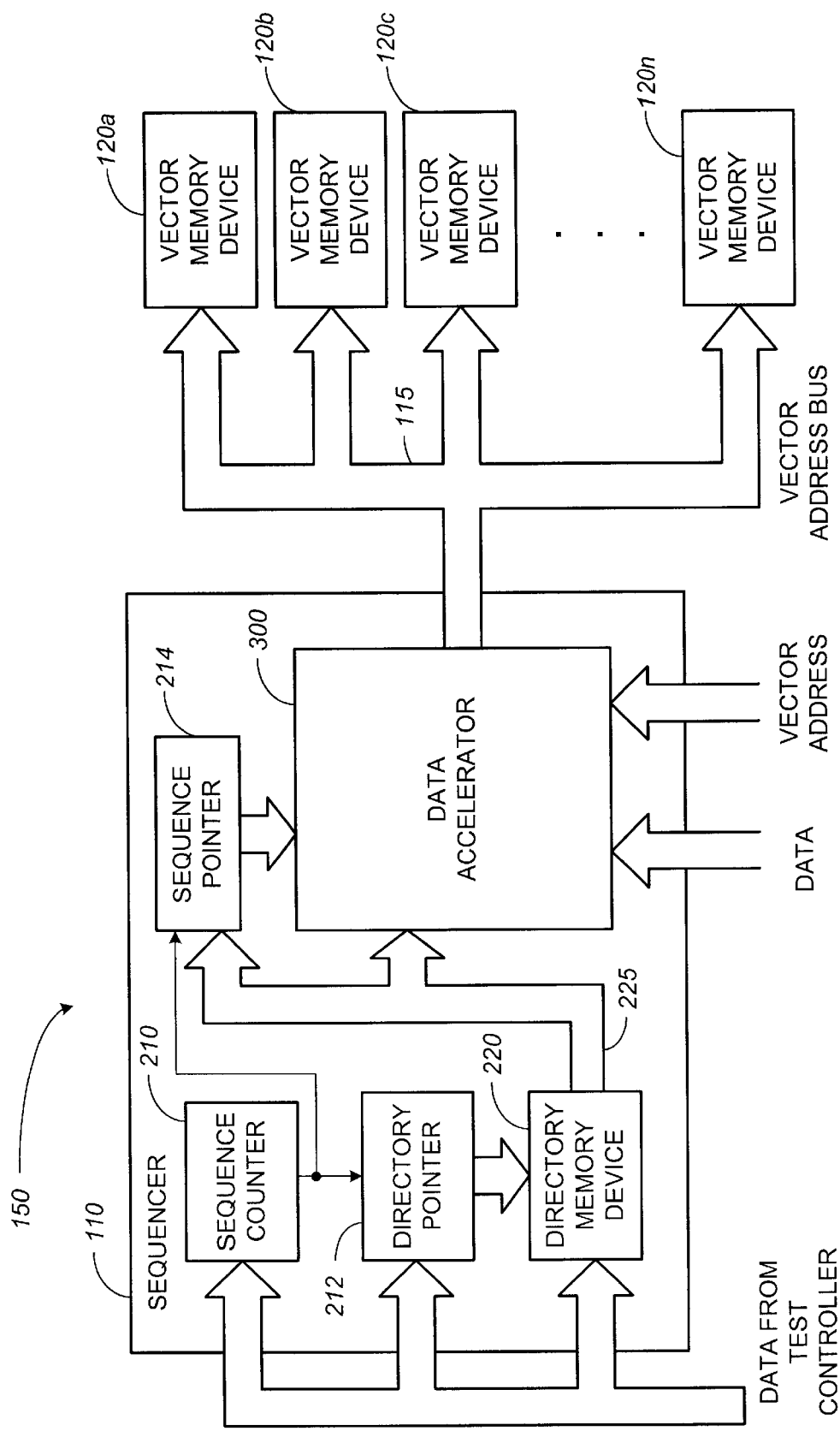
FIG. 2 is a functional block diagram illustrating a sequencer in an improved circuit tester that may be used in the test and in-circuit programming system of FIG. 1.

Reference is now directed to FIG. 2, which presents a schematic diagram of an exemplar improved circuit tester 150. The improved circuit tester 150, as illustrated in FIG. 2, includes a sequencer 110. The sequencer 110 comprises a directory memory device 220 along with an associated directory pointer 212, a data accelerator 300 along with an associated sequence pointer 214, and a sequence counter 210. As shown in FIG. 2, both the directory pointer 212 and the sequence pointer 214 may be coupled to the sequence counter 210 to coordinate the application of a plurality of sequence memory addresses per an associated directory memory address.

The data accelerator 300 may include a sequence memory device (not shown in FIG. 2). The sequence memory device may be a random access memory element or other electronic storage means. The sequence memory device stores vector addresses. The directory memory device 220 may identify a sequence of vector addresses designated for application on the vector address bus 115. The sequence counter 210 may respond to a control signal forwarded from a test controller to apply multiple vector addresses from the sequence memory device (one vector during each subsequent clock cycle).

The directory memory device 220, in its simplest form, may be a counter, which identifies a different sequence stored in a sequence memory device with each clock cycle. However, in this simplest of forms, none of the sequences stored in the sequence memory device would be repeated. In more practical applications, sequences tend to repeat because some structures of the DUT 200 are regular and repetitive. Thus, the directory memory device 220 may generally be a random access device or other electronic storage device that stores directory sub-programs, such as, but not limited to, loops and subroutines. The directory sub-programs are addressed and initiated by a test controller as illustrated in FIG. 2. As will be further explained below in association with FIG. 4, the test controller may be among other devices, a microprocessor or a computer. The directory memory device 220 provides information to the test controller informing the test controller when the directory memory device 220 has completed a directory sub-program. A system clock (not shown) may provide test initiation and timing signals between the test controller and the sequencer 110.

Vector memory devices 120 (FIG. 1) store sets of signals associated with unique test vectors. The set of signals applicable to test pins associated with each of the respective drive/receive module 130 (FIG. 1) may be loaded into the vector memory devices 120 via data ports associated with the vector address bus 115. Likewise, data corresponding to the sequences of vector addresses may be loaded into the sequence memory device of the data accelerator 300, and the data necessary to operate the directory memory device 220 may be loaded into the directory memory device 220. The data necessary to operate the sequencer 110 may be passed from the directory memory device 220 to the sequence pointer 214 via data bus 225. In addition, and as shown in FIG. 2, some signals may be forwarded from the directory memory device 220 to the data accelerator 300 via the data bus 225. Signals forwarded from the directory memory device 220 to the data accelerator 300 may include a clock and/or other synchronous signals that may be combined and/or otherwise processed within the data accelerator 300 to generate a switch control signal.

The vector memory devices 120, the sequence memory device (within the data accelerator), and the directory memory device 220 together store the test application program in a compressed form. This may be illustrated by a simple example. Assuming there are five test pins associated with each drive/receive module 130 (FIG. 1) in the circuit tester 100, each test pin connected to a single node of the DUT 200. Further, assume there are five vector memory devices 120, and each address in a vector memory device 120, stores a single signal. A test vector would include the five signals stored at a given address in the five vector memory devices 120. Also, assume the test program includes eight test vectors. An incomplete example of a test program and the unique test vectors in the test program are shown in Table I below.

TABLE I

| CLOCK CYCLE | SIGNAL OUTPUT BY VECTOR MEMORY DEVICE 120: | | | | | UNIQUE VECTOR |
|---|---|---|---|---|---|---|
| | 120a | 120b | 120c | 120d | 120e | |
| 1 | 0 | 0 | 0 | 0 | H | a |
| 2 | 0 | 0 | 0 | 1 | H | b |
| 3 | 0 | 0 | 1 | 1 | H | c |
| 4 | 0 | 1 | 0 | 0 | L | d |
| 5 | 1 | 1 | 0 | 0 | H | e |
| 6 | 0 | 1 | 0 | 0 | H | f |
| 7 | 0 | 1 | 1 | 1 | L | g |
| 8 | 0 | 0 | 0 | 1 | H | b |

As shown in Table I, the first through fourth vector memory devices 120a to 120d output a "0" signal on the first clock cycle, while the fifth vector memory device 120e outputs an "H" or logic-high signal. The test vector output on the first clock cycle is 0000H. Test vector 0000H is labeled "a" in the last column. In the second clock cycle the test vector 0001H is output. Test vector 0001H is different from test vector "a" and is labeled test vector "b." Likewise, in the third through sixth clock cycles, unique test vectors are output and are labeled "c" through "g." In the fourth clock cycle, the first, third, and fourth vector memory elements 120a, 120c, and 120d output a "0" signal on the first clock cycle, while the second vector memory element outputs an "L" or logic-low signal. In the eighth clock cycle the test vector 0001H is output. Test vector 0001H is the same as test vector "b" output in the second clock cycle. Thus for this test program, the number of test vectors stored is compressed from eight to seven unique test vectors. Generally, tests involve a much larger number of test vectors and the compression is correspondingly greater. Additional in-circuit test equipment and testing methods are described in U.S. Pat. Nos. 4,598,245, 4,642,561, 4,652,814, and 5,402,427, which are entirely incorporated herein by reference.

Those skilled in the art should appreciate that preferred embodiments of the improved circuit tester 150 may encode multiple bits to forward more than one signal. For example, the improved circuit tester 150 may forward five states per driver (i.e., "logic-high," "logic-low," "keep," "toggle," "high-impedance," and "don't-care-about-the-received-value" for the receivers). These five states per driver or receiver require 3 bits, or signals, to encode them. Integrated circuit assembly manufacturers have found it efficient to create application programs that combine the test programs described above with the data necessary to program in-circuit programmable integrated circuits. The application program can then be used to program and test programmable integrated circuits at the end of the production line.

The programmable devices include, but are not limited to, non-volatile memory devices, such as flash memory devices, and programmable logic devices, such as complex programmable logic devices (CPLDs), and volatile memory devices such as field programmable gate-arrays (FPGAs). Note that within the programmable logic industry, there is no consistency on the naming convention for non-volatile programmable logic (which is usually called CPLDs) and volatile programmable logic (which is usually called FPGAs). For example, Lattice Semiconductor, of Hillsboro, Oreg., U.S.A., manufactures a non-volatile programmable logic device, which they refer to as an FPGA. Further note that in a manufacturing environment, there are few compelling reasons to program non-volatile programmable logic devices with a circuit tester, other than to perform a thorough test of all circuit devices, since for most designs, the logic device would become subsequently erased as soon as power was removed from the circuit assembly.

Those skilled in the art will appreciate that the improved in-circuit tester is capable of not only applying vectors to a device to program data into the device, but the reading of data from a programmable device to validate that it has been programmed correctly. The vector memory devices 120 hold not only drive information but also receive information. Therefore, the sequences of vector addresses stored in the sequence memory device can also be applied to verify that the correct data has already been programmed into the various programmable devices integrated within the DUT 200. Though programming of electrical devices has been combined with the testing of the devices, those skilled in the art often continue to refer to the combined equipment and methods as test equipment and test methods.

The application programs are generally translated, or compiled, during the testing/programming process. In the translation and/or compiling step, the translator or compiler reads the application program and produces a form of the application data that may be used by the improved circuit tester 150 to both program and test an integrated circuit assembly. The amount of compiled or translated data necessary to test and program programmable logic devices is generally greater than the storage capacity of the sequence memory devices, such as the sequence memory device provided in the data accelerator 300 of FIG. 2. In order to overcome the limited storage capacity of the sequence memory device, test application programs are often segmented. The data accelerator 300 of the improved circuit tester 150 provides a system that continues to process test application and/or programmable device data on the fly without having to stop and reload a sequence memory device to process subsequent segments.

Figure 3:
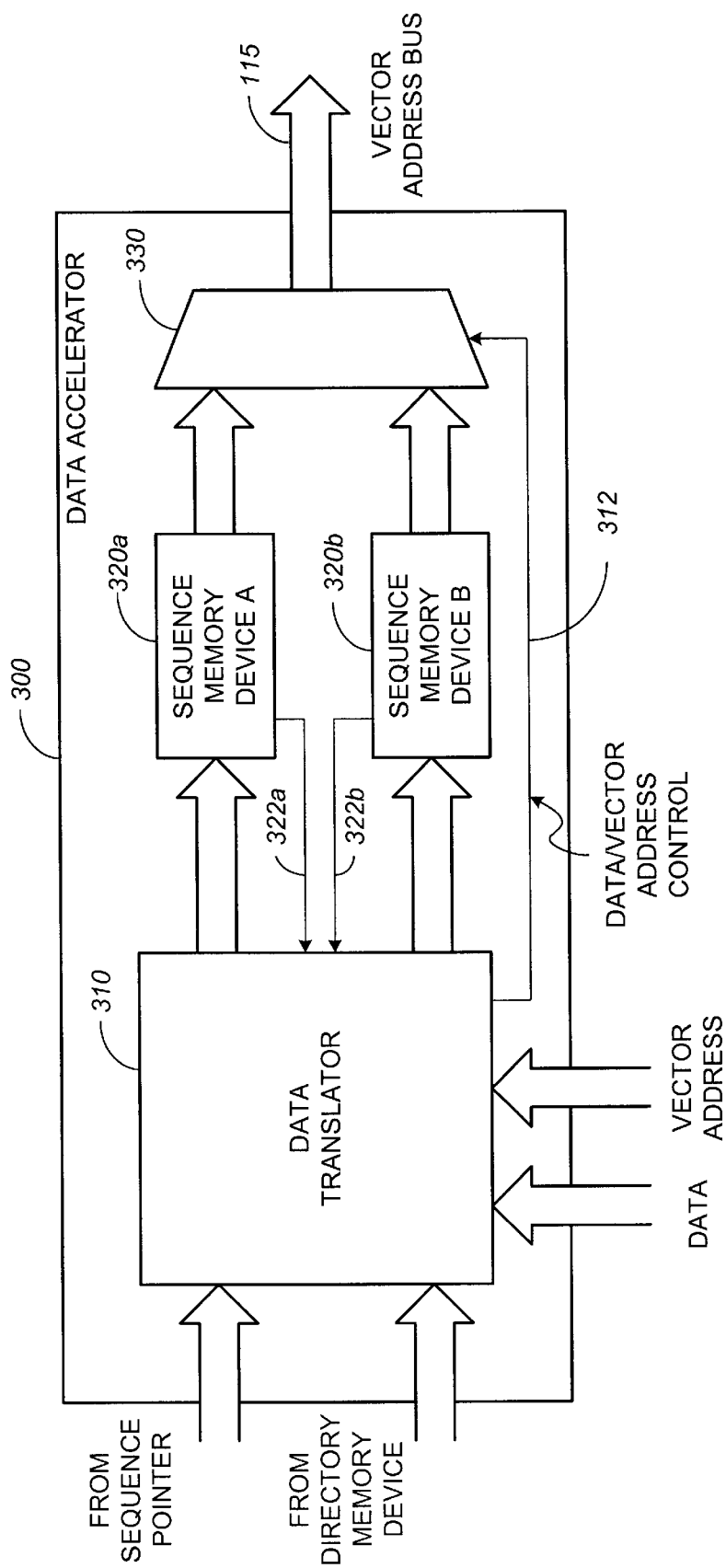
FIG. 3 is a schematic diagram illustrating the data accelerator of the improved circuit tester of FIG. 2.

The data accelerator 300 is further illustrated and described in association with the schematic diagram of FIG. 3. As shown in FIG. 3, the data accelerator 300 includes a data translator 310, a plurality of sequence memory devices 320, and a switch 330. To prevent stopping, reloading, and restarting the sequencer 110 to process multiple segments of a long test application and/or a long segment of programmable device data, the data accelerator includes at least one additional sequence memory device 320 (e.g., sequence memory device 320b). The data accelerator 300 illustrated in FIG. 3, via the data translator 310 and the switch 330, is configured to alternate between the sequence memory device 320a and sequence memory device 320b to keep the sequencer 110 continuously interacting with the plurality of vector memory devices 120 (see FIGS. 1 and 2). While at least one of the plurality of sequence memory devices 320a, 320b are actively supplying test and/or data vectors to the vector address bus 115 the remaining sequence memory bank may be reloaded with a subsequent data segment.

As further illustrated in FIG. 3, the data translator 310 and the switch 330 may be simultaneously controlled via a data/vector address control signal. The address control signal flows from the test controller to the sequencer/data accelerator/data translator, to indicate to the data translator 310 that the data translator 310 has the permission of the central processing unit of the test controller to switch to a different sequence memory device 320. In a preferred embodiment, circuitry inside the data translator 310, based on signals from the directory memory device (220) forwarded along bus 225 actually generates the "data/vector address control" signal 312, which controls the switch. This two-step process allows the switch control to change synchronously with the sequencer's clock, rather than the test controller's clock, which would cause chaos. Those skilled in the art will appreciate that the switch may be realized with a multiplexor.

In a preferred embodiment, once a sequence memory bank 320 that was actively communicating via the switch 330 and the vector address bus 115 with the plurality of vector memory devices 120 has completed a segment transmission, the sequence memory device 320 will forward a segment transmission complete signal to the data translator 310. As illustrated in FIG. 3, each of the plurality of sequence memory devices 320a and 320b is configured to supply the segment transmission complete, or alternatively, a segment acquisition complete signal via respective control interfaces 322a and 322b. Once the data translator 310 receives both a segment acquisition complete and a segment transmission complete signal, the data translator 310 may reconfigure internal paths and the switch 330.

The switch 330 is configured to direct a previously stored subsequent data segment to the vector address bus 115. Simultaneously, the internal paths of the data translator 310 will forward another data segment to the sequence memory device 320 that was transmitting the previous data segment to the vector address bus 115. In a preferred embodiment, the data translator 310 switches to the other sequence memory device, after the data translator 310 has received permission from the test controller 400 to proceed.

Figure 4:
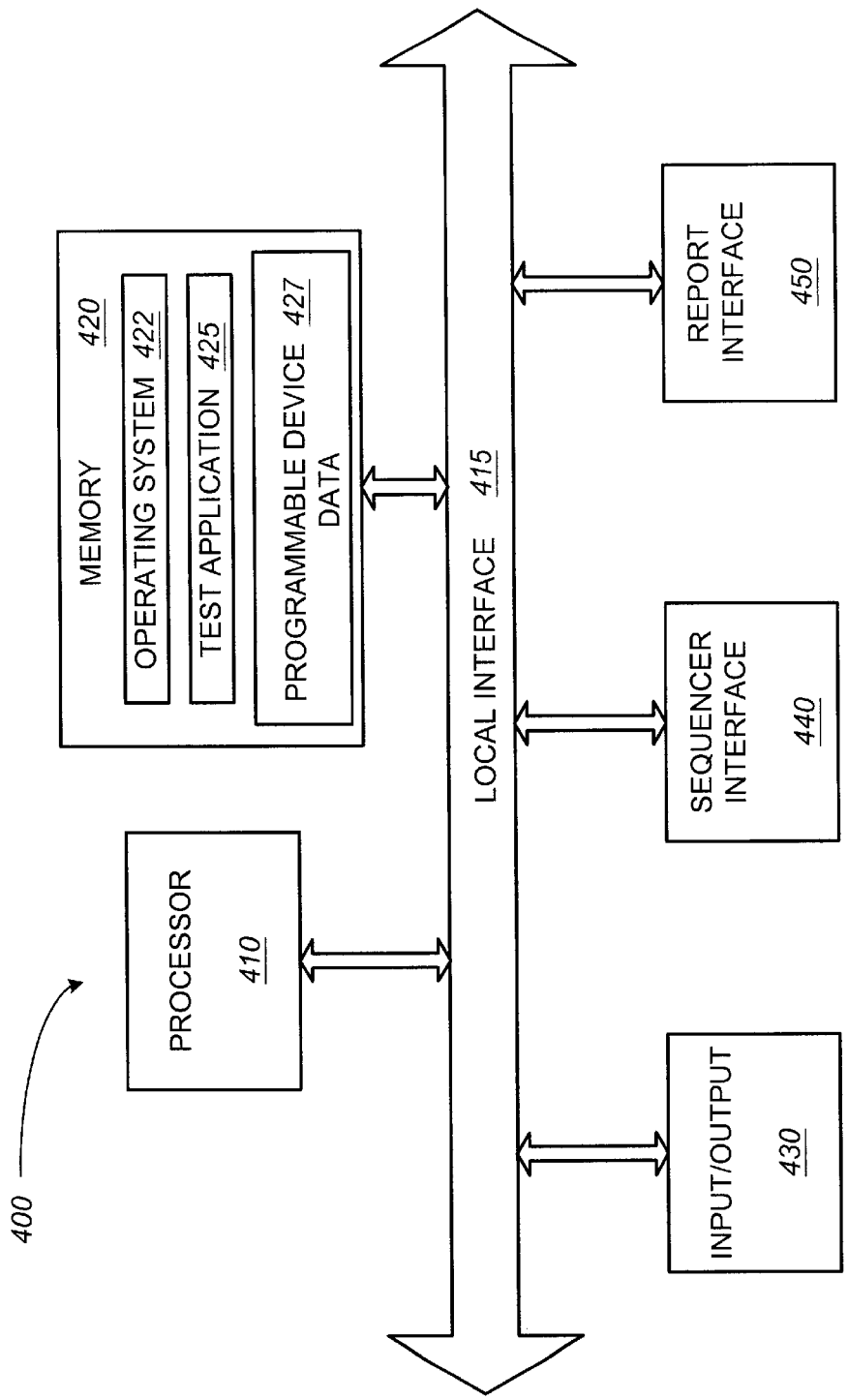
FIG. 4 is a schematic diagram illustrating the test controller of FIG. 2.

In some embodiments, the data translator 310 includes a mechanism to translate and/or compile the sequence memory data on the fly from the original "programming" data received by the test controller 400 (FIG. 4). Much of the translation may be performed in dedicated hardware in order to achieve the desired throughput performance of the improved circuit tester 150. While preferred embodiments implement the data translator 310 in hardware, those skilled in the art will appreciate that the data translator 310 may be embodied in software and/or firmware. Proprietary data formats may necessitate various configurations to generate appropriate sequence memory device 320 data. Whatever the nature of the data format, the directory memory device 220 and vector memory device 120 contents may be setup in a repeating pattern so that only data in the sequence memory devices 320a and 320b is reloaded to encode the address and data information for each program segment.

Once one of the sequence memory devices 320a is loaded the sequencer 110 can be started. While the sequencer 110 is running (i.e., processing the "program" stored in the directory memory device 220 to forward the test vectors from sequence memory device 320a, the next segment of sequence memory contents is loaded into the sequence memory device 320b from the data translator 310. As previously noted, once one sequence memory device 320 has forwarded a segment of the programming data to the vector address bus 115, and once another sequence memory device 320 has acquired the next segment of the programming data from the test controller 400 (FIG. 4), the data translator 310 may direct a swap of the sequence memory devices 320*a* and 320*b* by reconfiguring the switch 330.

When programming "flash" and/or other in-circuit programmable devices the improved circuit tester 150 may function as follows. The data segments alternatively written into the sequence memory devices 320*a*, 320*b* become the address of the vector, which drives the appropriate information to the DUT 200. The DUT 200 data and address bits may be divided into 8-bit (i.e., "byte") lanes. A lookup table may be included in each vector memory device 120 which may be configured to encode each possible combination of the 8-bit lane. In order to forward a particular 8-bit value via a particular byte lane, the data value may be added to an address of the lookup table for the particular byte lane. For example, if a desired data value, 0×D3 was intended for an application starting at address 0×1F00 within the vector memory device 120, then the appropriate contents of the sequence memory bank 320 would be 0×1FD3. When the sequence memory bank 320 applies 0×1FD3 to the vector address bus 115, the drivers for the byte lane apply 0×D3 to the DUT 200.

In preferred embodiments, the data translator 310 also addresses the variable width of both data and address busses on the DUT 200. The data translator 310 may accomplish this by applying the correct number of sequence memory bank write events for the width of the DUT's address and data busses. In order to maximize throughput of the improved circuit tester 150, the test controller may be configured to write data to the data translator 310 in its most natural (i. e., the fastest) form. Thus the data translator 310 converts the number and size of data write events received from the test controller 400 with the number of address and data writes it forwards to one of the plurality of sequence memory devices 320.

Reference is now directed to FIG. 4, which presents a schematic view illustrating an exemplar architecture of the test controller 400 introduced in FIG. 2. The test controller 400 can be any of a variety of wired and/or wireless computing devices, such as desktop computers, portable computers, dedicated server computers, multi-processor computing devices, among others. Irrespective of its type, the test controller 400 typically comprises a processor 410, memory 420, one or more input/output devices 430, a sequencer interface 440, and one or more report interfaces 450, each of which is connected to a local interface 415. The local interface 415 can be, but is not limited to, one or more buses or other wired or wireless connections as is known in the art. The local interface 415 may have additional elements, such as buffers (caches), drivers, and controllers (omitted here for simplicity), to enable communications. Further, the local interface 415 includes address, control, and data connections to enable appropriate communications among the aforementioned components.

The processor 410 can include any custom made or commercially available processor, a central processing unit (CPU) or an auxiliary processor among several processors associated with the test controller 400, a semiconductor based microprocessor (in the form of a microchip), a macro-processor, one or more application-specific integrated circuits (ASICs), a plurality of suitably configured digital logic gates, and other well known electrical configurations comprising discrete elements both individually and in various combinations to coordinate the overall operation of the test controller 400.

The memory 420 can include any one of a combination of volatile memory elements (e.g., random access memory (RAM), such as dynamic random access memory (DRAM), static random access memory (SRAM), etc.)) and nonvolatile memory elements (e.g., read only memory (ROM), hard drives, tapes, compact disc read only memories (CDROM), etc.).

The input/output devices 430 comprise those components with which an operator of the circuit tester can interact with the test controller 400. For example, where the test controller 400 comprises a personal computer (PC), these components can comprise a keyboard, a mouse, a joystick, etc. Where the test controller 400 comprises other computing devices, these components can comprise function keys or buttons, a touch-sensitive display screen, a stylus, etc. The display can comprise any of a number of various technologies. For example, the display may be a cathode ray tube or plasma device commonly used with PCs or the display may be implemented with a liquid crystal display (LCD) among others.

The sequencer interface 440 is adapted to facilitate connection of the test controller 400 to a circuit tester 100 (see FIG. 1) and may include one or more serial, parallel, small computer system interface (SCSI), universal serial bus (USB), IEEE 1394 (e.g., Firewire™), and/or other components. As illustrated in the functional block diagram of FIG. 4, the test controller 400 is configured to enable the transfer of at least a test application 425 and/or programmable device data 427 as may be desired to the circuit tester 100.

The report interface 450 comprises the various components used to transmit and/or receive data responsive to the test results to various devices in communication with the test controller 400. For example, the report interface 450 may be configured to transfer information reflective of the DUT, test date, time, programmable device data versions downloaded, test application version, as well as a variety of other information. The report interface 450 may be configured to send the test information to a specific device via a network, to a data disk in communication with the test controller 400, to a tape, and/or to a printer in communication with the test controller 400. The report interface 450 may include, by way of example, a device that can communicate both inputs and outputs, for instance, a modulator/demodulator (e.g., modem), a wireless (e.g., radio frequency (RF)) transceiver, a telephonic interface, a bridge, a router, and/or a network card, etc.

It should be appreciated that the various software and/or firmware described above can be stored on any computer-readable medium for use by or in connection with any computer-related system or method. In the context of this document, a computer-readable medium denotes an electronic, magnetic, optical, or other physical device or means that can contain or store a computer program and/or data for use by or in connection with a computer-related system or method. These programs can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can store, communicate, propagate, or transport the program and/or data for use by or in connection with the instruction execution system, apparatus, or device.

The computer-readable medium can be, for example but not limited to, an electronic, magnetic, optical, electromagnetic, infrared, or semiconductor system, apparatus, device, or propagation medium. More specific examples (a non-exhaustive list) of the computer-readable medium include an electrical connection having one or more wires, a portable computer diskette, a random access memory (RAM), a read-only memory (ROM), an erasable programmable read-only memory (EPROM, EEPROM, or Flash memory), an optical fiber, and a portable compact disc read-only memory (CDROM). Note that the computer-readable medium can even be paper or another suitable medium upon which a program is printed, as the program can be electronically captured, via for instance optical scanning of the paper or other medium, then compiled, interpreted or otherwise processed in a suitable manner if necessary, and then stored in a computer memory.

Exemplar systems having been described above, an exemplar method for improving data throughput and data capacity in an in-circuit tester will be discussed below. In this regard, the following discussions describe steps illustrated in the flowchart of FIG. 5. It should be understood that any process steps or blocks in the flowchart may represent modules, segments, or portions of code that include one or more executable instructions for implementing specific logical functions or steps in the associated process. It should be appreciated that although particular process steps are described, alternative implementations are feasible. Moreover, some method steps may be executed out of order from that shown or discussed, including substantially concurrently or in reverse order, depending on the functions involved. For example, the method illustrated in FIG. 5 may be applied to program in-circuit programmable devices on a DUT 200. The method illustrated in FIG. 5, may also be applied to test a DUT 200 by forwarding and monitoring the response to a plurality of test vectors as previously described.

Figure 5:
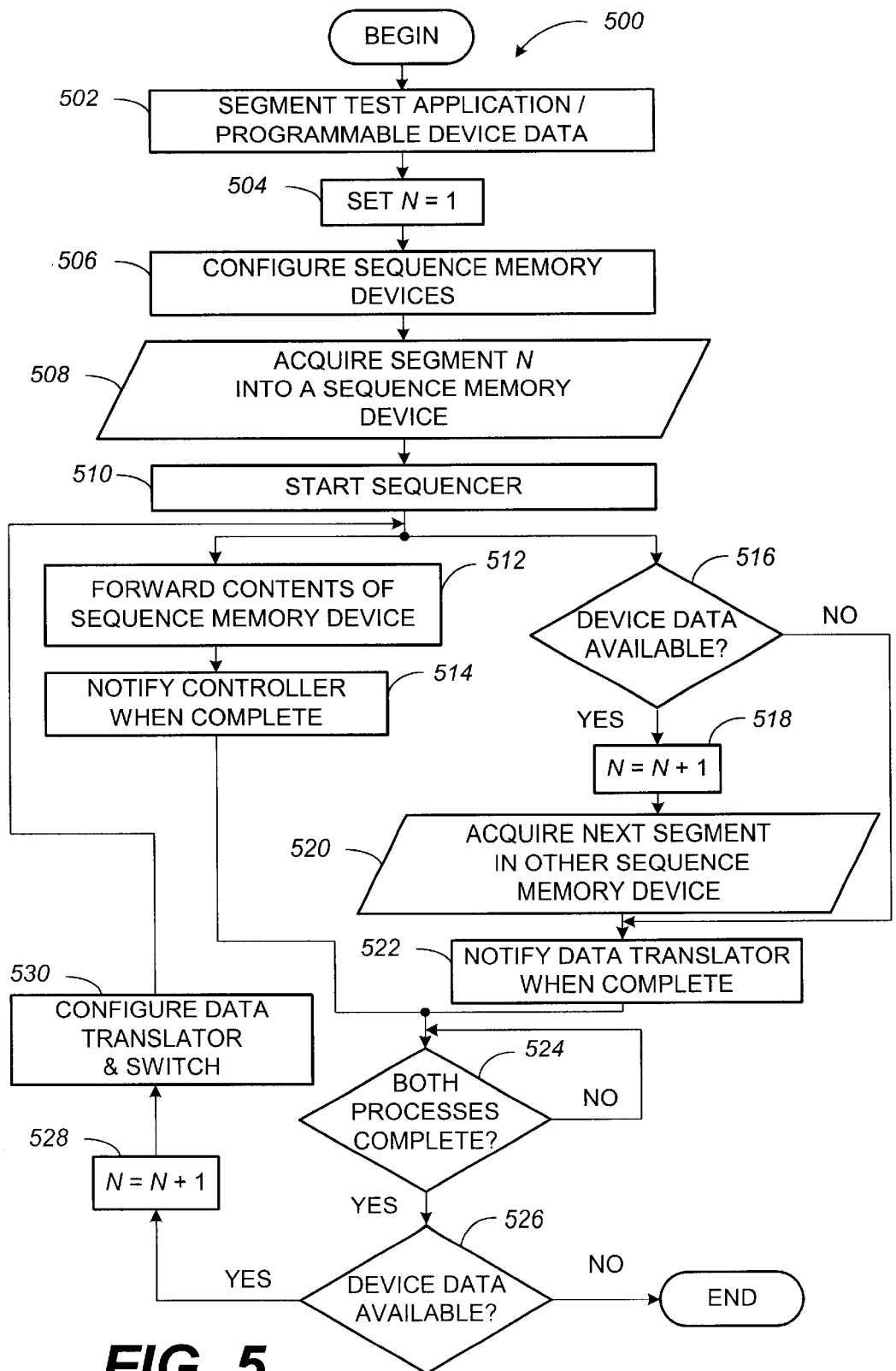
FIG. 5 is a flowchart illustrating a method for increasing data throughput and data capacity that may be realized in the improved circuit tester of FIG. 2.

Reference is now directed to FIG. 5, which presents a flowchart illustrating a method for increasing data throughput and effective data capacity that may be realized in the improved circuit tester 150 of FIG. 2. In this regard, the method for increasing data throughput and increasing effective data capacity 500 may be practiced by segmenting a test application and/or segmenting programmable device data as indicated in step 502 such that the largest segment falls within the data storage capacity of the plurality of sequence memory devices 320 of the improved circuit tester 150. For those cases where the circuit assembly to be tested by the improved circuit tester 150 includes programmable integrated circuits that will be "programmed" just prior to test, program segments should be sent prior to test application segments. This preliminary segmenting step (i.e., step 502—segmenting the test application and programmable device data) may be performed manually by a test operator and/or in association with a test controller 400 or by various other methods as will be appreciated by those skilled in the art. It should also be appreciated that programmable device data may be segmented prior to or substantially simultaneously with test application data as may be desired or as resources permit.

As illustrated in FIG. 5, a segment counter may be initialized in step 504. As indicated in step 506, the sequencer 110 may configure the outputs of the data translator 310 and the switch 330 to supply a first segment of test application and/or programmable device data to a designated sequence memory bank 320. For cases where in-circuit programmable devices will be "programmed in-circuit" before testing the DUT 200, programmable device data segments will be processed before test application segments. Otherwise, the improved circuit tester 150 may be configured to simply forward test application segments as explained below.

As previously described in association with the data accelerator of FIG. 3, each of the programmable device data segments will include both address and data information configured such that the improved circuit tester 150 applies the correct data value to the correct circuit tester interface pins to program and/or test the DUT 200. After configuring the data translator 310 and the switch 330 to provide the necessary interfaces for the plurality of sequence memory devices 320 in step 506, the improved circuit tester 150 may be configured to acquire a first segment as illustrated in step 508. Next, as shown in step 510, the improved circuit tester 150 may be configured to start the sequencer 110.

As described above, the improved circuit tester 150 includes a sequencer 110 capable of both forwarding the contents of the first segment acquired in one of the plurality of sequence memory devices 320 as shown in step 512, and simultaneously acquiring a subsequent test application and/or programmable device data segment as illustrated in steps 516 through 520. Importantly, the improved circuit tester 150 is configured to notify the test controller 400 when the transfer of the first segment is complete as illustrated in step 514. As shown in step 522, when the entire contents of a subsequent segment is acquired in a sequence memory device 320, the improved circuit tester 150 is configured to notify the data translator 310.

As further illustrated by the "NO" response arrow that exits the query of step 516, if the sequencer 110 is forwarding the last data segment to the DUT 200 (i.e., no more data segments are available) the improved circuit tester 150 may be programmed to notify the data translator 310 as indicated in step 522 that the data segment acquisition process is complete.

The data translator 310 associated with the improved circuit tester 150 may be programmed to wait until it receives an indication that both segment processing tasks are complete. This can be accomplished by periodically performing the query illustrated in step 524. In practice, the data translator 310 controls the state of the data/vector address control signal 312 to appropriately configure the switch 330 that forwards the contents of a sequence memory device 320 to the vector address bus 115. The data translator 310 is configured to modify the state of the switch 330 only after receiving an acknowledgement from the test controller 400 that it is permissible to continue. As indicated by the negative response flow control arrow, the query of step 524 may be repeated until such time that both segment processing steps have terminated.

After the first acquired segment has been forwarded via the vector address bus 115 to the plurality of vector memory devices 120 and the associated plurality of drive/receive modules 130, and the subsequent data segment has been temporarily stored in a sequence memory device 320, the test controller 400 may be configured to check if subsequent segments are available as indicated by step 526. If the response to the query of step 526 is affirmative, the test controller 400 may be configured to increment the counter set in step 504, as indicated by step 528, and to configure the data translator 310 and the switch 330 to reconfigure the inputs and outputs of the plurality of sequence memory devices 320 as indicated in step 530.

As indicated by the flowchart of FIG. 5, the parallel processes following step 510 illustrated by steps 512 and 514 (forwarding a data segment) and steps 516 through 522 (acquiring a data segment), may be repeated as necessary to simultaneously process each of the remaining test application and/or programmable device data segments. Otherwise, if the response to the query of step 526 is negative, i.e., the improved circuit tester 150 has processed all segments the method for improved data throughput and increased data capacity 500 may terminate.

While the improved circuit tester 150 and the method for improved data throughput and increased data capacity 500 has described a system with two sequence memory devices 320a, 320b, it should be appreciated that other embodiments are possible. For example, some embodiments may include a plurality of sequence memory devices 320 configured to acquire subsequent segments while a separate plurality of sequence memory devices 320 is forwarding previously acquired data segments. In practice, there is no limit to the amount of program or test vector data that can be deployed to the DUT 200 by the improved circuit tester 150 with multiple sequence memory devices 320.

In preferred embodiments, at least one sequence memory device 320 is pre-loaded with appropriate sequence data before starting the sequencer 110. In other embodiments, a plurality of sequence memory devices 320 may be pre-loaded before the improved circuit tester 150 initiates sequencer 110.

It should be emphasized that the above-described embodiments, particularly, any "preferred" embodiments, are merely possible examples of implementations, merely set forth for a clear understanding of the principles of the systems and methods for increased data throughput in a circuit tester. Many variations and modifications may be made to the above-described embodiment(s) of the systems and methods for increased data throughput without departing substantially from the spirit and principles thereof. For example, the improved circuit tester 150 includes multiple sequence memory devices 320, a directory memory 220, a data translator 310, a test controller 400, etc. As described above, the test controller 400 is "in charge of" or the "point of control" for coordinating segment flow.

Those skilled in the art will appreciate that the "point of control" could be placed in other elements of the improved circuit tester 150. By way of example, the "point of control" could be moved to the data translator 310. Stated another way, the data translator 310 could be modified to address control functions, thereby unloading other portions of the circuit tester 150 from control tasks. All such modifications and variations are intended to be included herein within the scope of this disclosure as protected and set forth by the following claims.

We claim the following:

1. A method for increasing throughput and data capacity in a circuit tester used to program in-circuit programmable devices, comprising the steps of:
   segmenting programmable device data into a plurality of data segments;
   configuring a test sequencer to forward a first data segment to a first sequence memory device;
   acquiring the first data segment in the first sequence memory device;
   starting the test sequencer;
   forwarding the first data segment from the first sequence memory device and acquiring a subsequent data segment in a second sequence memory device;
   detecting a condition responsive to the completion of both the forwarding and acquiring steps associated with the respective first and second sequence memory devices;
   reconfiguring the test sequencer to forward the subsequent data segment from the second sequence memory device and to acquire a further subsequent data segment in the first test sequencer storage device; and
   repeating the detecting and reconfiguring steps to alternatively forward and acquire each subsequent data segment in the first and second sequence memory devices until the last of the plurality of data segments has been forwarded.

2. The method of claim 1, wherein the steps of configuring and reconfiguring the test sequencer permit simultaneous forwarding and acquiring of data segments.

3. The method of claim 1, wherein the step of configuring comprises forwarding data to a vector address bus.

4. The method of claim 1, wherein the step of detecting comprises receiving an indication that the entire data segment being acquired has been received in at least one of the first and second sequence memory devices.

5. The method of claim 1, wherein the step of detecting comprises receiving an indication that the entire data segment being forwarded has been transferred to a vector address bus.

6. The method of claim 1, wherein the step of reconfiguring comprises generating a first control signal.

7. The method of claim 6, wherein the first control signal is applied to a data translator.

8. The method of claim 6, wherein the first control signal is combined with a synchronous signal from the directory memory device, and wherein the combination generates a second control signal that is applied to a switch.

9. The method of claim 8, wherein the switch is coupled to a plurality of inputs and an output bus.

10. The method of claim 1, further comprising:
    segmenting a test application into a plurality of test application segments;
    configuring a test sequencer to forward a first test application segment to a first sequence memory device;
    acquiring the first test application segment in the first sequence memory device;
    forwarding the first test application segment from the first sequence memory device and acquiring a subsequent test application segment in a second sequence memory device;
    detecting a condition responsive to the completion of both the forwarding and acquiring steps associated with the respective first and second sequence memory devices;
    reconfiguring the test sequencer to forward the subsequent test application segment from the second sequence memory device and to acquire a further subsequent test application segment in the first sequence memory device; and
    repeating the detecting and reconfiguring steps to alternatively forward and acquire each subsequent test application segment in the first and second sequence memory devices until the last of the plurality of data segments has been forwarded.

11. A method for increasing throughput and data capacity in a circuit tester, comprising the steps of:
    segmenting a test application into a plurality of test application segments;
    configuring a test sequencer to forward a first test application segment to a first sequence memory device;
    acquiring the first test application segment in the first sequence memory device;
    forwarding the first test application segment from the first sequence memory device and acquiring a subsequent test application segment in a second sequence memory device;

detecting a condition responsive to the completion of both the forwarding and acquiring steps associated with the respective first and second sequence memory devices;

reconfiguring the test sequencer to forward the subsequent test application segment from the second sequence memory device and to acquire a further subsequent test application segment in the first sequence memory device; and repeating the detecting and reconfiguring steps to alternatively forward and acquire each subsequent test application segment in the first and second sequence memory devices until the last of the plurality of data segments has been forwarded.

12. The method of claim 11, wherein the steps of configuring and reconfiguring permit the simultaneous acquisition and forwarding of test application segments by respective sequence memory devices.

13. The method of claim 11, wherein the step of configuring comprises forwarding test application segments to a vector address bus.

14. The method of claim 11, wherein the step of detecting comprises receiving an indication that the entire test application segment being acquired has been received in at least one of the first and second sequence memory devices.

15. The method of claim 11, wherein the step of detecting comprises receiving an indication that the entire test application segment being forwarded has been transferred to a vector address bus.

16. The method of claim 11, wherein the step of reconfiguring comprises generating a first control signal.

17. The method of claim 16, wherein the first control signal is applied to a data translator.

18. The method of claim 16, wherein the first control signal is combined with a synchronous signal from the directory memory device, and wherein the combination generates a second control signal that is applied to a switch.

19. The method of claim 18, wherein the switch is coupled to a plurality of inputs and an output bus.

20. A system for accelerating throughput in a circuit assembly test sequencer, comprising:

a first means for applying a segment of test application data to at least one of a plurality of sequence memory devices;

a second means for applying a previously stored segment of test application data to a bus;

a control means for selectively adjusting the first and second means, wherein subsequently received segments of test application data are forwarded to at least one of the plurality of sequence memory devices that is not presently applying a test application segment to the bus.

21. The system of claim 20, wherein the first means comprises a data translator.

22. The system of claim 20, wherein the second means comprises a switch.

23. The system of claim 20, wherein the control means is coupled to the first and second means such that when a segment of data is being read from at least one of the plurality of sequence memory devices, a subsequent segment of data is being written to at least one of the plurality of sequence memory devices.

24. The system of claim 22, wherein the switch is coupled to a plurality of inputs and an output bus.

25. The system of claim 20, wherein the first and second means for applying a segment of test application data are configured to apply a segment comprising programmable device data.

26. A data accelerator, comprising:

a data translator configured to receive a test sequence pointer and a test vector address, wherein the data translator selectively forwards a segment of data comprising a plurality of test vector addresses on at least one of a plurality of translator outputs;

a plurality of sequence memory devices coupled to the plurality of data translator outputs, each of the plurality of sequence memory devices having a respective output; and a switch coupled to the outputs of each of the plurality of sequence memory devices, the switch responsive to a control signal, wherein the switch routes a segment of data stored in at least one of the sequence memory devices to a bus, while the data translator receives and forwards a subsequent segment of data to at least one of the remaining sequence memory devices.

27. The system of claim 26, wherein the data translator selectively forwards a segment of data responsive to a control signal.

28. The system of claim 26, wherein the switch selects at least one of the plurality of sequence memory device outputs as an input in response to a control signal.

29. The system of claim 26, wherein the data translator selectively forwards a segment of data and the switch selects at least one of the plurality of sequence memory device outputs as an input in response to a single control signal.

30. The system of claim 29, wherein the control signal is responsive to an indication that the at least one sequence memory device forwarding data has forwarded an entire segment.

31. The system of claim 29, wherein the control signal is responsive to an indication that the at least one sequence memory device receiving data has received an entire segment.

32. The system of claim 29, wherein the control signal is responsive to both an indication that the at least one sequence memory device receiving data has received an entire segment and an indication that the at least one sequence memory device forwarding data has forwarded an entire segment.

* * * * *